(12) United States Patent
Saxena

(10) Patent No.: US 7,701,261 B2
(45) Date of Patent: Apr. 20, 2010

(54) CONTROLLED IMPEDANCE CMOS OUTPUT BUFFER

(75) Inventor: Saurabh Saxena, Jaipur (IN)

(73) Assignee: STMicroelectronics Pvt. Ltd., Greater Noida (UP) (IN)

( * ) Notice: Subject to any disclaimer, the term of this patent is extended or adjusted under 35 U.S.C. 154(b) by 0 days.

(21) Appl. No.: 11/766,275

(22) Filed: Jun. 21, 2007

(65) Prior Publication Data

US 2008/0048735 A1 Feb. 28, 2008

(30) Foreign Application Priority Data

Jun. 22, 2006 (IN) .................. 1478/DEL/2006

(51) Int. Cl.
*H03B 1/00* (2006.01)
*H03K 3/00* (2006.01)

(52) U.S. Cl. ...................................... 327/108; 327/112

(58) Field of Classification Search ................. 327/108, 327/112
See application file for complete search history.

(56) References Cited

U.S. PATENT DOCUMENTS

2006/0132212 A1* 6/2006 Shimazawa .................. 327/277

* cited by examiner

*Primary Examiner*—Lincoln Donovan
*Assistant Examiner*—Daniel Rojas
(74) *Attorney, Agent, or Firm*—Hogan & Hartson LLP

(57) ABSTRACT

A CMOS Output Buffer providing controlled output impedance includes three internal sections each of which provides a impedance control for a corresponding region of the output V-I characteristics of deep linear, deep saturation and transition regions. Each internal section includes controlled current sinks/current sources enabled to provide a precise control over the DC impedance of the driver across the PAD voltage range.

20 Claims, 11 Drawing Sheets

CONTROLLED IMPEDANCE CMOS OUTPUT BUFFER

RELATED APPLICATION

The present application claims priority of Indian Patent Application No. 1478/Del/2006 filed Jun. 22, 2006, which is incorporated herein in its entirety by this reference.

FIELD OF INVENTION

The present invention relates to an output buffer for digital integrated circuits. Specifically, the invention pertains to a digital output buffer having a low tolerance in Driver DC impedance.

BACKGROUND OF THE INVENTION

Circuit interconnects play a critical role in modern day electronic circuits. At the same time, the increasing switching speeds is making the design of these interconnects more complex as it is no longer possible to model using lumped elements. The interconnects have to be modeled as transmission lines. Transmission line behavior results in reflections in case of impedance mismatch between the Line Driver and the transmission line or the transmission line and the load. These reflections are unwanted as they add noise to the system and compromise the detectability of the signals.

Hence, while designing the output driver, special care has to be taken to provide the correct output impedance. The output impedance has to be such that the reflections on the transmission line are minimized.

There have been a number of attempts in the prior art to design a driver with a DC impedance in a narrow range of values. These attempts have focused on controlling the impedance in the deep linear and the deep saturation regions of operation. Even if the impedance is controlled quite accurately in these two regions, the impedance in the intermediate region is less controlled. This limitation leads to the problem of maintaining the impedance in the desired range of values in the intermediate region of operation.

FIG. 1 and FIG. 2 show the V-I characteristic for a typical output driver. As shown, the V-I characteristic of FIG. 1 can be divided into two regions as shown in FIG. 2. The first region is known as the Linear Region while the second region is called the Saturation Region.

FIG. 3 shows a circuit implementation known in the art. There are 2 operating conditions—one in which transistors N1 and N2 are in the linear region and the other in which the transistors N1 and N2 enter saturation. As the PAD voltage is decreased, the transistors move from the saturation region to the linear region. If the two transistors are designed such that the current flows in their boundaries, in the linear region, then the current saturates at high pad voltages and drops below the lower limit on the slow corners. The addition of transistor N3 solves this problem. As the gate of this transistor is connected to the pad, the transistor can turn ON only after the pad voltage rises above the threshold voltage of this transistor. N3 sinks significant current only when the Vgs for this transistor increases well above the threshold voltage. The pad voltage corresponding to this condition is dependent on the source voltage of N3 which in turn is dependent on the pull down strength of N2. In order to turn-on N3 at a lower PAD voltage, it is necessary to increase the strength of N2. However, making N2 strong also increases the current sinking by N2 and N1 in the linear region. This action disturbs the DC impedance in the linear region. Hence this approach does not provide a uniform DC impedance across the V-I characteristics.

FIGS. 4 and 5 show two other known designs for the output buffer using two diode connected transistors connected in parallel with N1. FIG. 4 shows known design for the output buffer wherein transistor 60 corresponds to N1 and transistor 62 corresponds to N2. In this implementation N3 is replaced by two diode connected transistors 50 and 52 connected in parallel with 60. This approach also suffers from the same problem of not controlling the Impedance in the transition region.

FIG. 6 shows the operating characteristic of a DDR buffer indicating the specified operating limits.

FIG. 7 shows the variation in operating characteristic for a DDR output buffer achieved using conventional designs. Tracings "A" define the specification boundaries. Tracing "B" shows the worst case result for the slower side and tracing "C" shows the worst case achieved on the faster side. As can be seen the specification boundaries are being violated in both cases.

It is therefore desirable to provide a mechanism that controls the DC impedance in all three regions of operation. Such an arrangement will lead to a better control over the band in which the impedance varies and hence provide better matching between the driver and the transmission line.

SUMMARY OF THE INVENTION

The object of the present invention is to provide a mechanism for reducing the variation of the output driver impedance in digital integrated circuits over voltage and temperature variations.

It is a further object of the instant invention to provide a mechanism for maintaining the output driver impedance across process variations.

To achieve these objects, the invention provides separate impedance control mechanisms for each of the three parts of the output driver DC V-I characteristic.

Accordingly, the present invention provides a digital output buffer which includes a first controlled output drive circuit having its input connected to the input of the buffer and providing a constant drive capability during the deep saturation region of operation, a second controlled output drive circuit having its input connected to the input of the buffer and providing the same drive capability for the deep linear region of operation, and a third controlled output drive circuit having its input connected to the input of the buffer and providing the same drive capability during the transition region of operation, wherein the first, second and third controlled output drive circuits have their outputs tied together to the output of the digital output buffer.

Preferably, the first output buffer is active when the pad voltage is less than 0.8V, the second output buffer is active when the pad voltage is greater than 0.8V and less than 1.5V, and the third output buffer is active when the pad voltage is greater than 1.5V.

The instant invention also provides a memory device using one or more digital output buffers which includes a first controlled output drive circuit having its input connected to the input of the buffer and providing a constant drive capability during the deep saturation region of operation, a second controlled output drive circuit having its input connected to the input of the buffer and providing the same drive capability for the deep linear region of operation, and a third controlled output drive circuit having its input connected to the input of the buffer and providing the same drive capability during the transition region of operation, wherein the first, second and third controlled output drive circuits have their outputs tied together to the output of the digital output buffer.

The present invention further provides a method for improving digital output buffers which includes the steps of providing a first controlled output driver having its input connected to the input of the buffer and providing a constant drive capability during the deep saturation region of operation, providing a second controlled output drive circuit having its input connected to the input of the buffer and providing the same drive capability for the deep linear region of operation, and providing a third controlled output drive circuit having its input connected to the input of the buffer and providing the same drive capability during the transition region of operation, wherein the first, second and third controlled output drive circuits have their outputs tied together at the output of said digital output buffer.

BRIEF DESCRIPTION OF THE DRAWINGS

The invention will now be described with reference to the accompanying drawings.

DETAILED DESCRIPTION OF A PREFERRED EMBODIMENT

Figure 1:
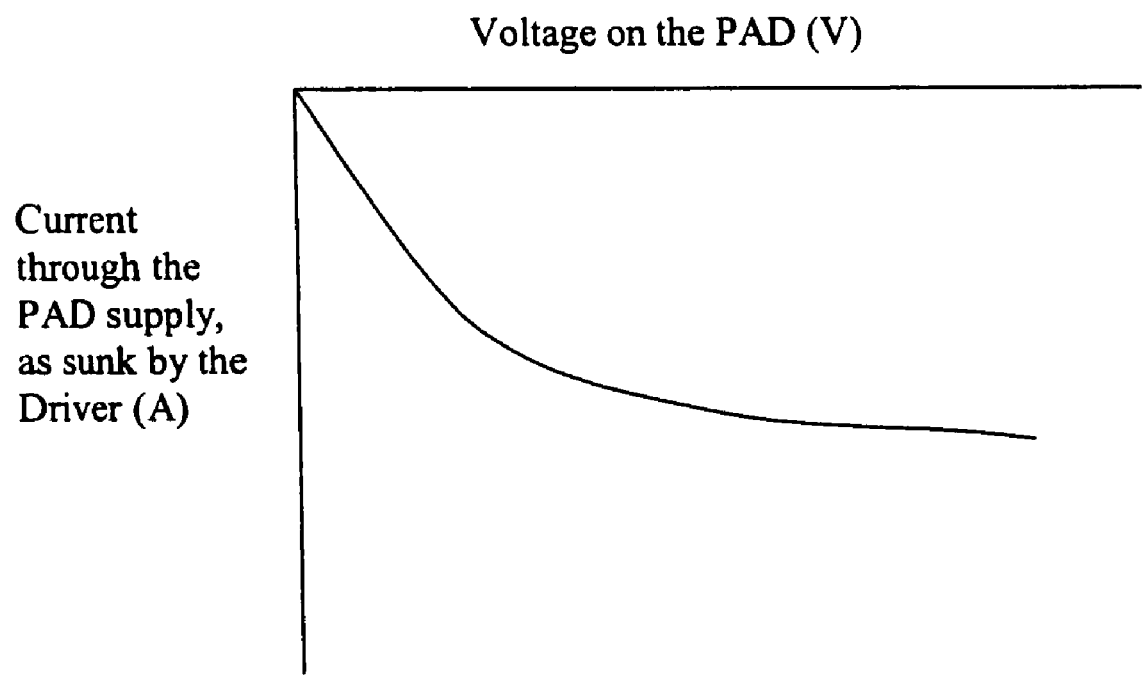
FIG. 1 shows the V-I characteristic of an output driver.
Figure 2:
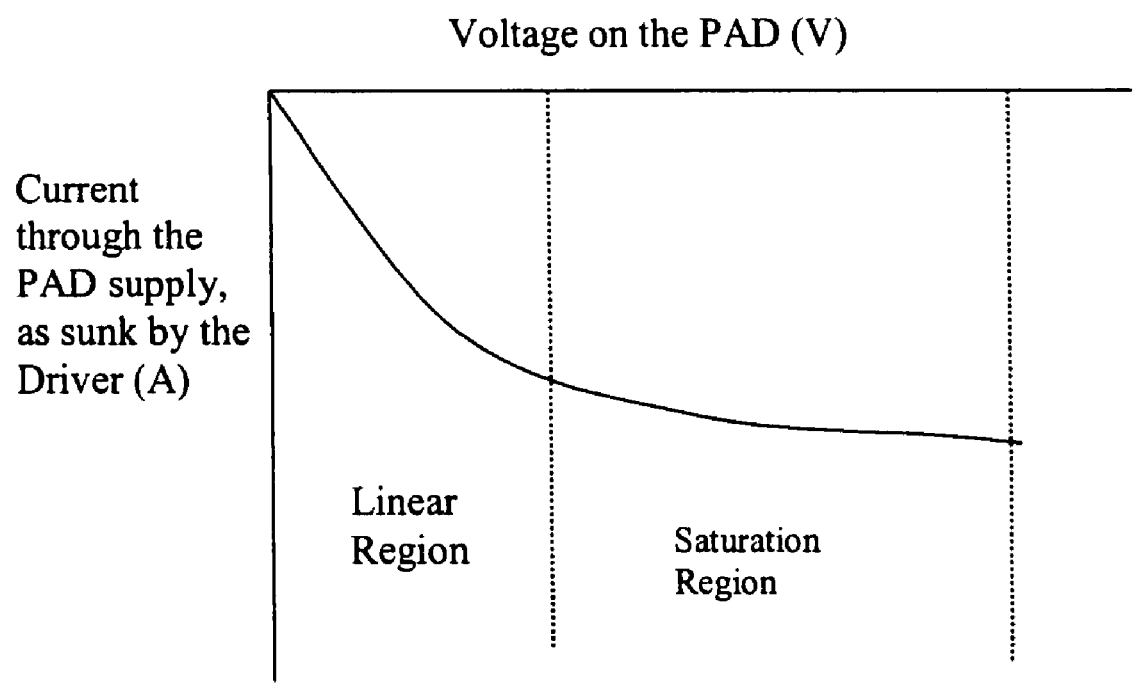
FIG. 2 shows the operating regions in the V-I characteristic of the output driver of FIG. 1.
Figure 3:
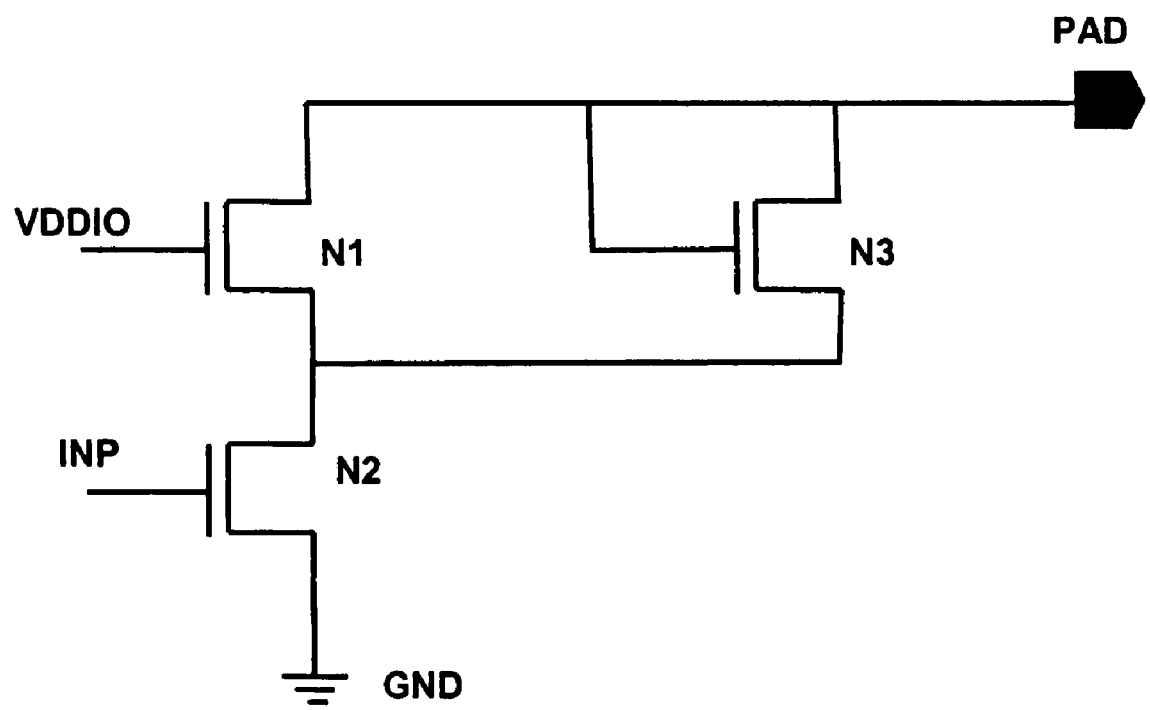
FIG. 3 shows a known implementation of the prior art.
Figure 4:
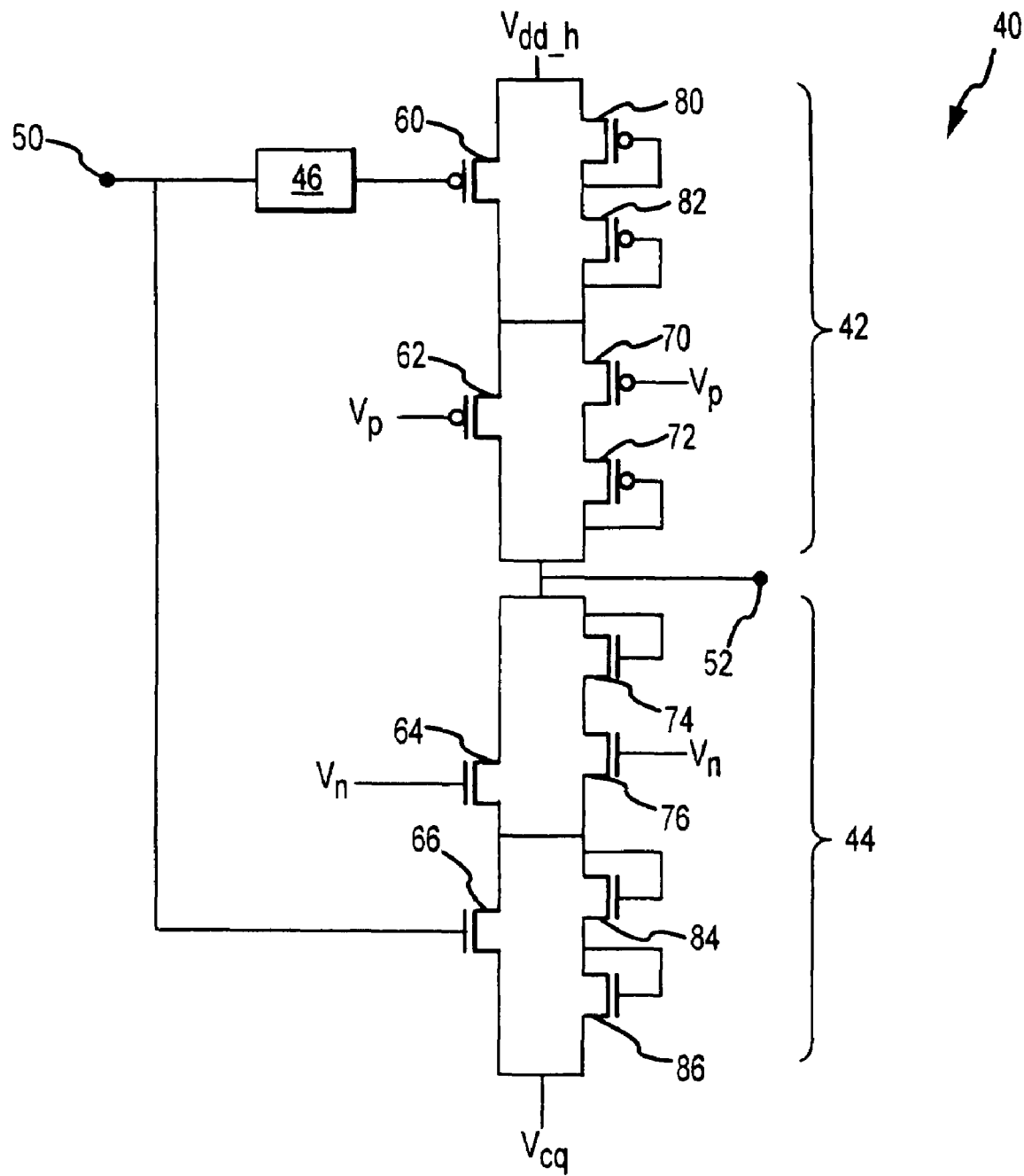
FIG. 4 shows another implementation of the prior art.
Figure 5:
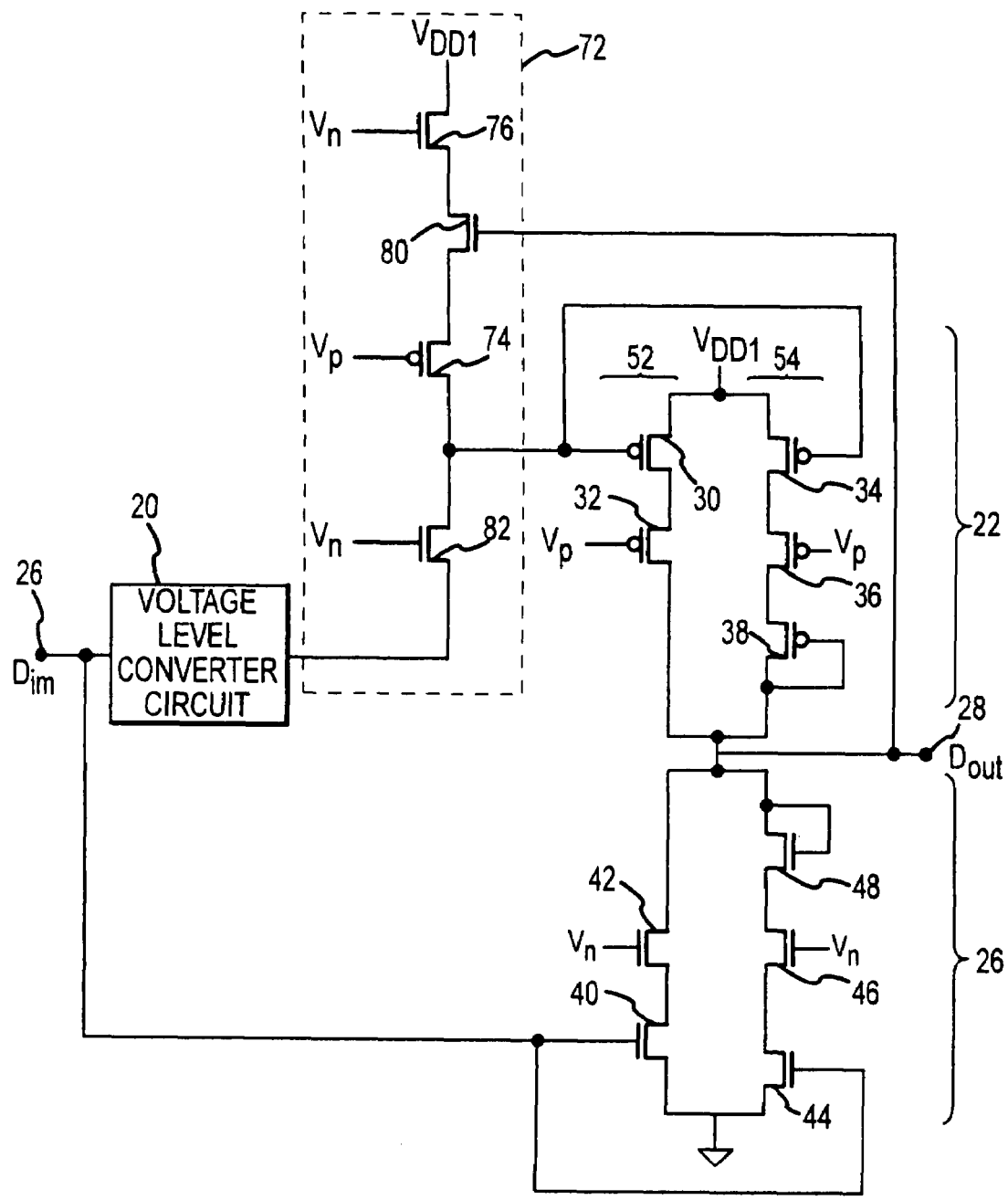
FIG. 5 shows another implementation of the prior art.
Figure 6:
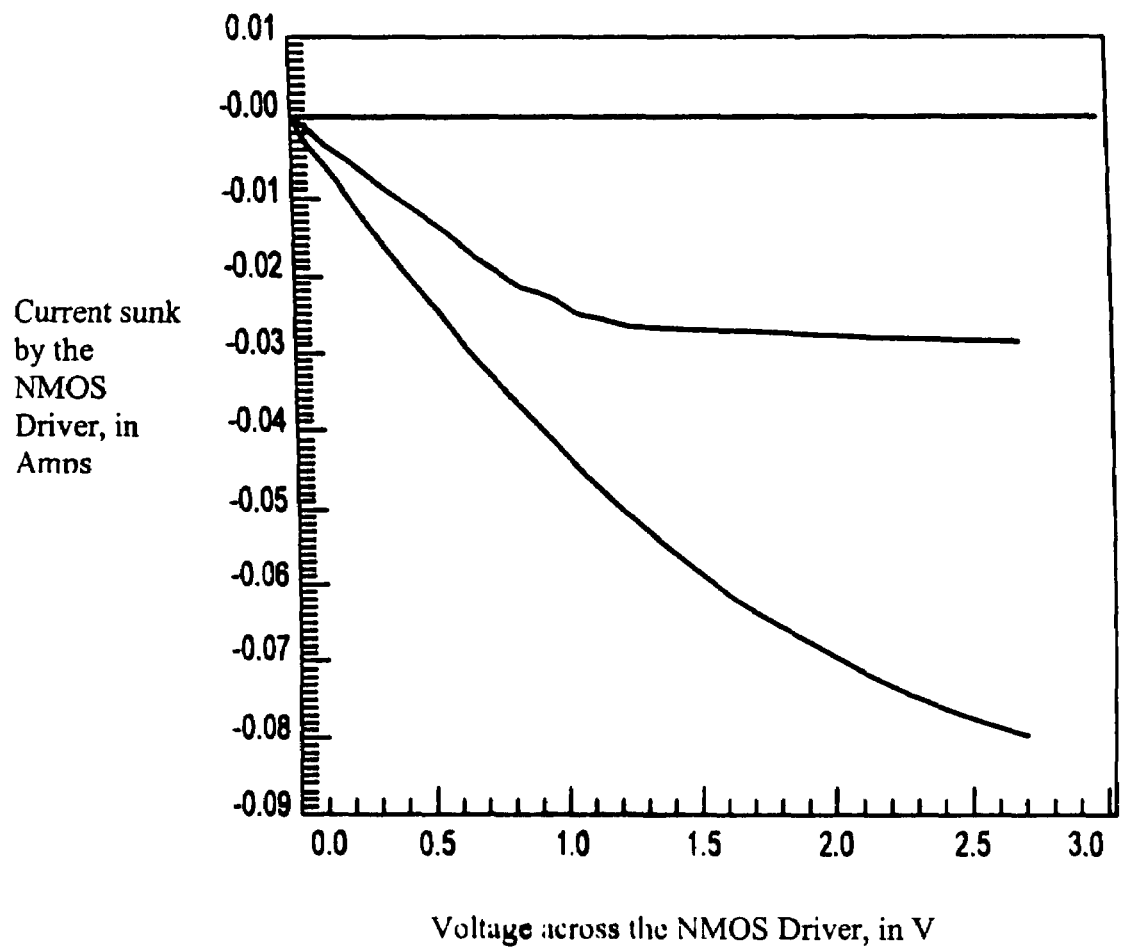
FIG. 6 shows the required output characteristic of an NMOS driver for a DDR buffer.
Figure 7:
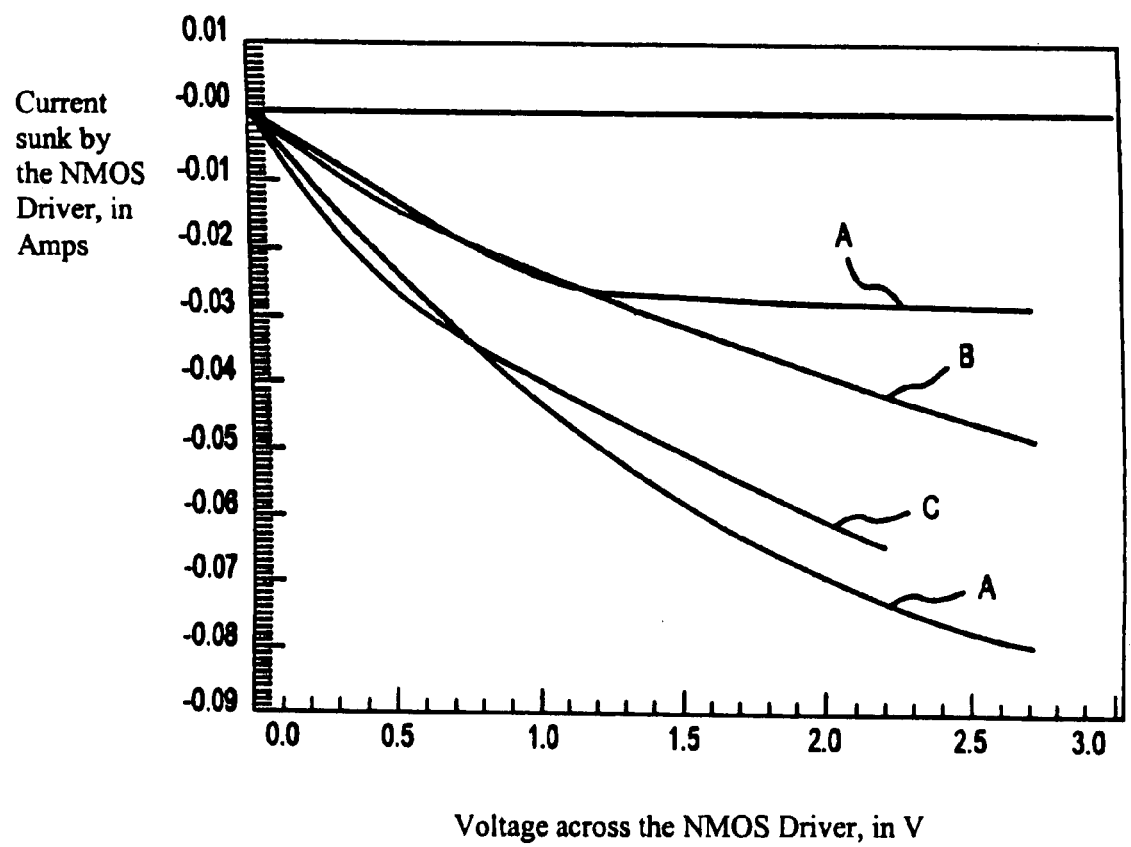
FIG. 7 shows the output characteristic of an NMOS driver for a DDR buffer as achieved by the known art.
Figure 8:
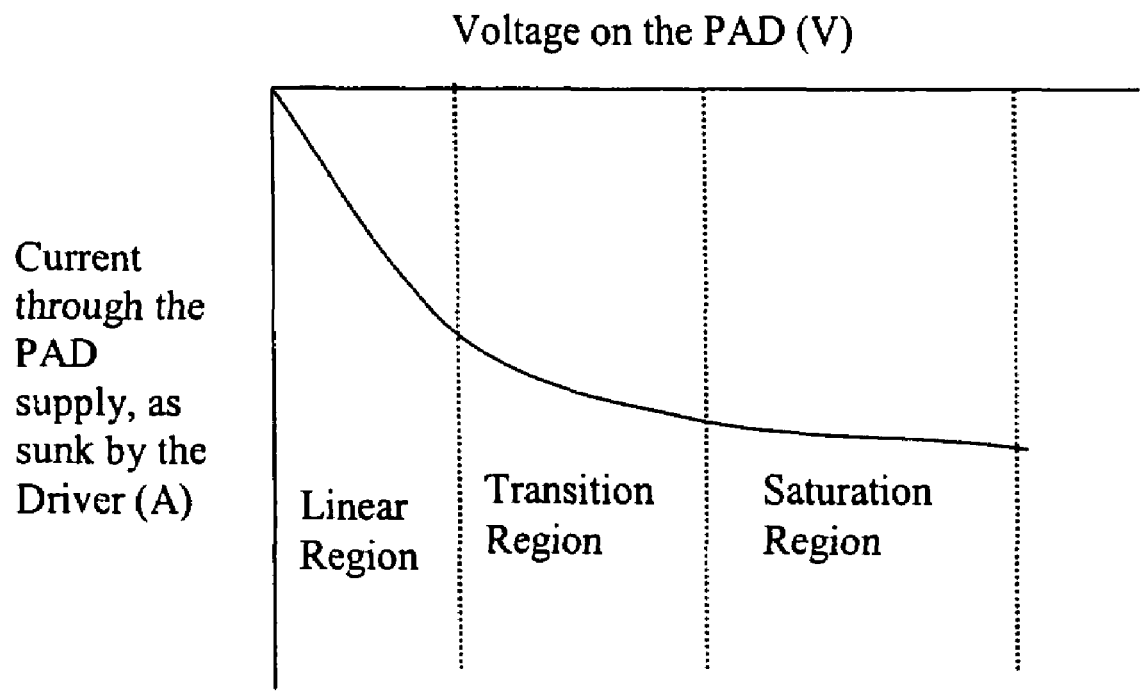
FIG. 8 shows the operating regions in the V-I characteristic of an output driver as implemented in the present invention.

The design of the present invention treats the operating characteristic as comprising three regions as shown in FIG. 8. These three regions are the Linear region, the Saturation region and the Transition region. The basis of this trifurcation is the current characteristic with respect to pad voltage. As shown, initially (Vpad=0V to 0.8V), the current rises linearly with the pad voltage. Beyond a certain limit the rise tapers off (Vpad=0.8V to 1.5V) and then finally the current saturates (Vpad=1.5V to Vdd).

Figure 9:
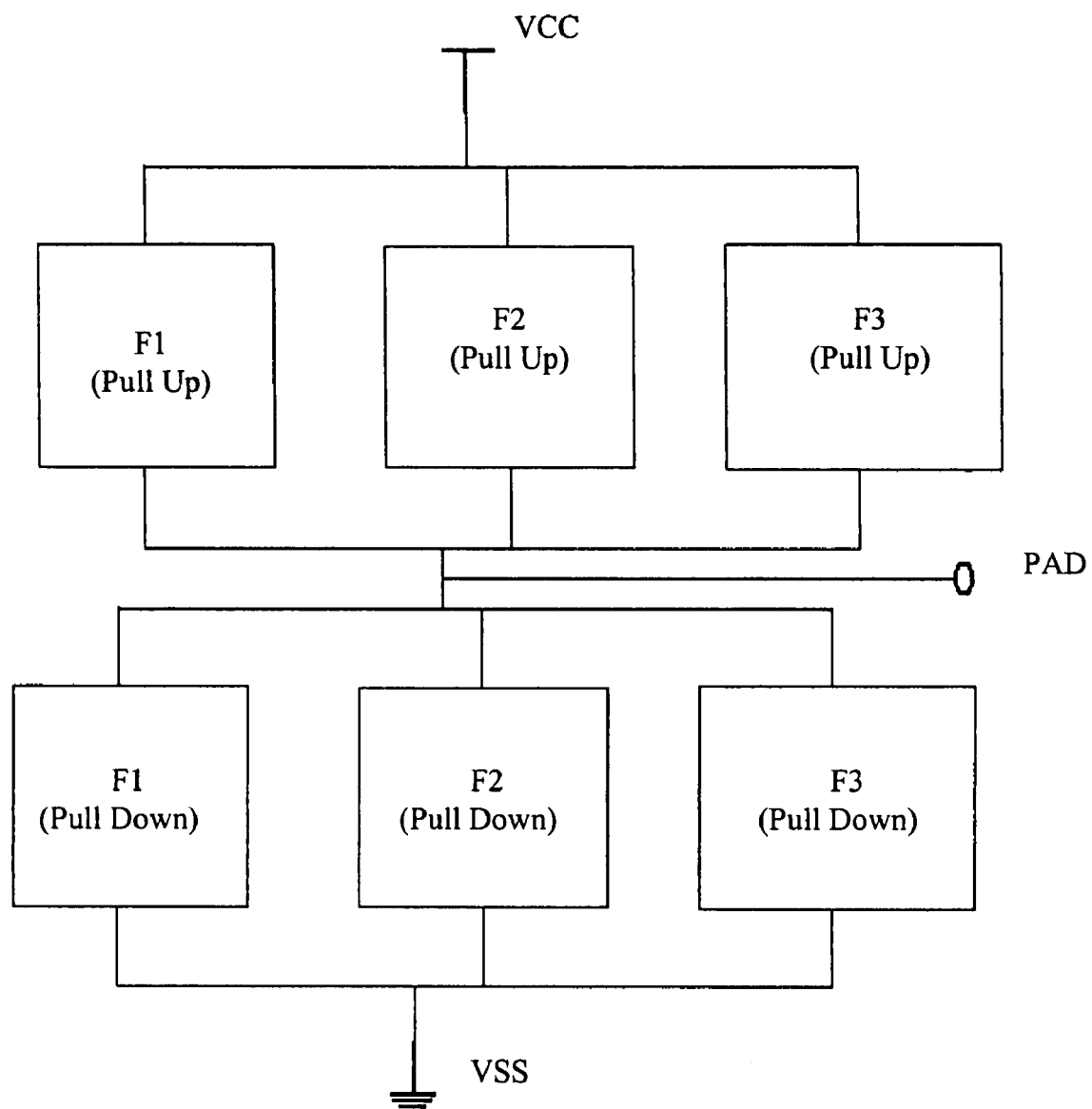
FIG. 9 shows a Block Diagram of the present invention.

The Block Diagram of the instant invention shown in FIG. 9 uses three blocks working in tandem to maintain the desired output impedance presented by the Pad over all operating conditions. The three blocks adjust their currents such that their sum changes as defined below, with linear increase in Pad voltage.

Let the current sunk by the three blocks be defined by f1, f2 and f3. all of which are functions of Pad Voltage.

$Ipad = f1 + f2 + f3$, and $Vpad/Ipad = Zpad$ (almost constant), where Ipad is the total current sunk by the driver from the Pad. Vpad is the Pad voltage and Zpad is the equivalent Pad impedance.

The names of the three operating regions are based on the current profile in each region.

Current f1 is required to vary proportionately to the Pad voltage, i.e. the current variation is more or less linear with the Pad voltage. Current f3 is required to be maintained almost constant, independently of the Pad voltage. However, the current should not fall below the maximum value of f1 (in the linear region). It should remain within a band with respect to the maximum value of f1 (in the linear region).

Any attempt to use the conventional approach (where the second block to sink current f2 does not exist) will fail in the region where f1 is fading out and f3 is strengthening.

Increasing the strength of f1 will not allow the impedance to be maintained in the linear region as even a slight change in f1 will change the impedance seen as well.

Strengthening f3 is also counter-productive as it limits the complete switching ON of the block. Any attempt to increase f3 will lead to the current in the saturation region exceeding the specified limit.

The addition of f2 for the intermediate period helps to solve the problem. The purpose of f2 is to compensate for the decreasing current of f1 so that there are no constraints on f3, which can be designed simply to suit the current profile in the saturation region.

Figure 10:
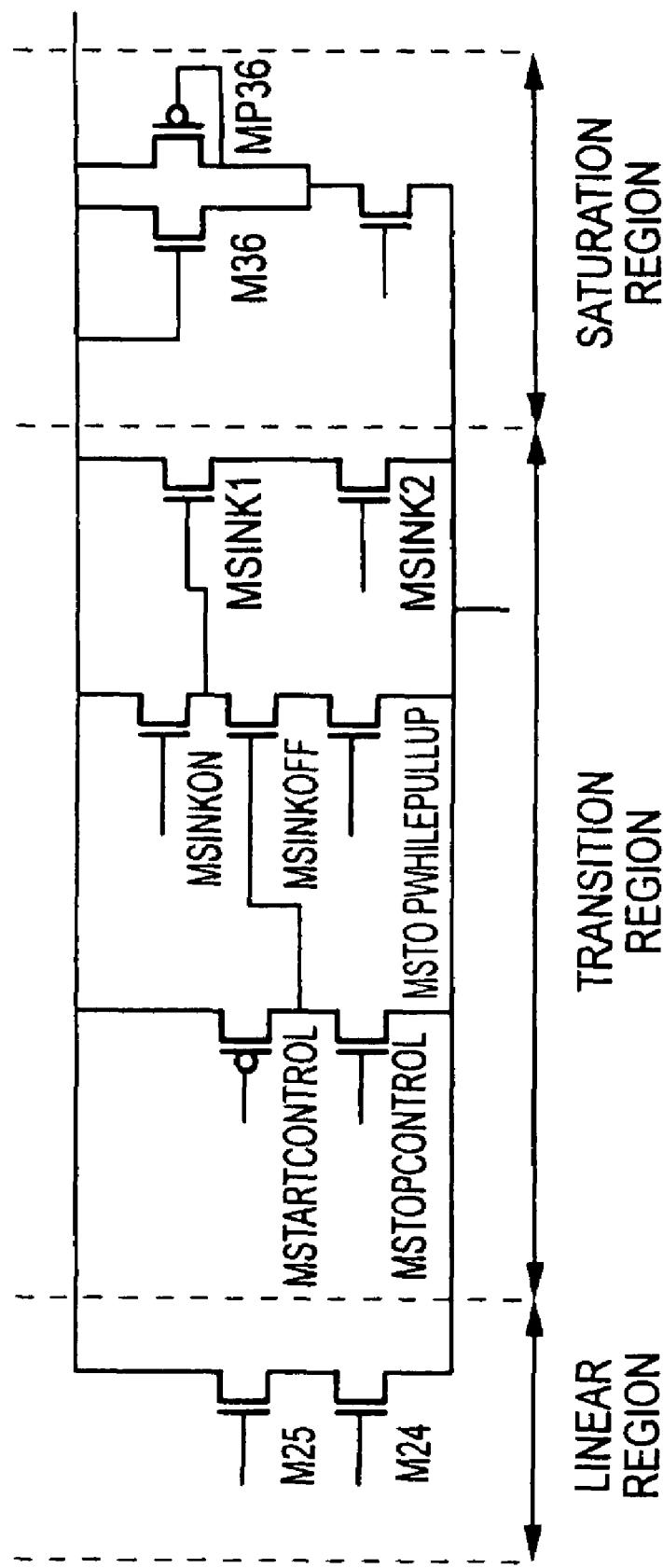
FIG. 10 shows a schematic of the proposed approach.

FIG. 10 shows a proposed circuit implementation. In the Linear region M24 and M25 are optimized such that the current remains within specifications across the corners. In order to maintain the current in the Saturation region, the source of M36 is separated from the drain of M24. This separation allows M36 to be started at a comparatively lower pad voltage and current in this region can be controlled without having an impact over the current in Linear and Transition region. This does improve the characteristic but does not solve the problem completely as M36 cannot be started before the pad rises above the threshold voltage.

Even if it gets ON, the current, which a transistor sinks depends on the overdrive level given to the transistor. This means that current variations in M24 and M25 cannot be compensated until the drive level reaches the desired value. If the size of M36 is enhanced significantly in order to increase the drive strength at lower voltages then current being drawn by this transistor at higher pad voltage exceeds the bounding curve in the fast corners. PMOS MP36 is provided in parallel to M36 in order to compensate for the change in current of NMOS on cross corners. This action decreases the extent by which the characteristic the specifications but does not provide full compensation. The structure containing transistors Mstartcontrol, Mstopcontrol, Msinkon, Msinkoff, Mstopwhilepullup, Msink1 and Msink2 provides the necessary compensation. This structure sinks the pad current during the 0.8 V to 1.5V pad voltage range i.e. this circuit operates in the Transition Region. It is designed such that it does not impact the current profile in the Linear and Saturation regions. Hence it can be made as strong as needed to compensate for the slowing down of the transistors M24 and M25 without altering the current being sunk at high pad values.

The output impedance of the PMOS driver is regulated in a similar manner.

Figure 11:
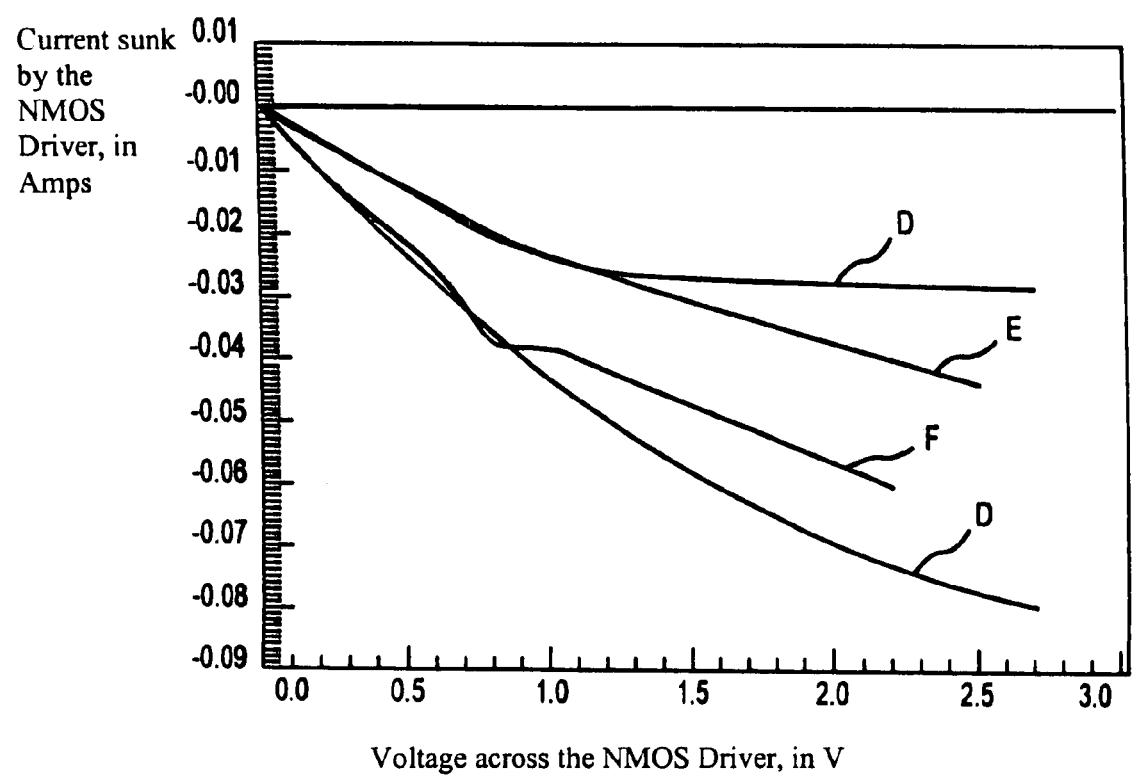
FIG. 11 shows the V-I characteristic for DDR obtained by using the proposed architecture.

FIG. 11 shows the improvement in performance resulting from the proposed method when applied to the DDR buffer. Tracings "D" are the specification boundaries. Tracing "E" is the worst case on the slower side, and tracing "F" is the worst case on the faster side. As shown, the operating characteristic is substantially within the specification boundaries.

Although the present invention has been described in detail, it should be understood that various changes, substitutions, and alterations can be made hereto without departing from the spirit and scope of the invention as defined by the appended claims.

I claim:

1. A digital output buffer having an input and an output coupled to a pad for supplying a pad voltage, said digital output buffer comprising:
   a first controlled output drive circuit having an input coupled to the input of the buffer, an output coupled to the output of the buffer, and providing a first drive capability during a deep saturation region of operation;
   a second controlled output drive circuit having an input coupled to the input of the buffer, an output coupled to the output of the buffer, and providing a second drive capability during a deep linear region of operation;
   a third controlled output drive circuit having an input coupled to the input of the buffer, an output coupled to the output of the buffer, and providing a third drive capability during a transition region of operation; and
   an output impedance of the digital output buffer that is substantially constant across the deep saturation region of operation associated with the first controlled output drive circuit, deep linear region of operation associated with the second controlled output drive circuit and transition region of operation associated with the third controlled output drive circuit as the pad voltage is varied.

2. The digital output buffer as claimed in claim 1 wherein said first output drive circuit is active when said pad voltage is less than a first voltage.

3. The digital output buffer as claimed in claim 2 wherein said first voltage is 0.8V.

4. The digital output buffer as claimed in claim 1 wherein said second output drive circuit is active when the pad voltage is greater than a first voltage and less than a second voltage.

5. The digital output buffer as claimed in claim 4 wherein said first voltage is 0.8V and said second voltage is 1.5V.

6. The digital output buffer as claimed in claim 1 wherein said third output drive circuit is active when the pad voltage is greater than a second voltage.

7. The digital output buffer as claimed in claim 6 wherein said second voltage is 1.5V.

8. The digital output buffer as claimed in claim 1 wherein said first controlled output drive circuit provides a constant drive capability.

9. The digital output buffer as claimed in claim 1 wherein said second controlled output drive circuit provides a linear drive capability.

10. The digital output buffer as claimed in claim 1 wherein said third controlled output drive circuit provides a linear drive capability.

11. A method for operating a digital output buffer having an input and an output coupled to a pad for supplying a pad voltage, said method comprising:
    providing a first controlled output drive circuit having an input coupled to the input of the buffer, an output coupled to the output of the buffer, and providing a first drive capability during a deep saturation region of operation;
    providing a second controlled output drive circuit having an input coupled to the input of the buffer, an output coupled to the output of the buffer, and providing a second drive capability during a deep linear region of operation;
    providing a third controlled output drive circuit having an input coupled to the input of the buffer, an output coupled to the output of the buffer, and providing a third drive capability during a transition region of operation; and
    providing an output impedance of the digital output buffer that is substantially constant across the deep saturation region of operation associated with the first controlled output drive circuit, deep linear region of operation associated with the second controlled output drive circuit, and transition region of operation associated with the third controlled output drive circuit as the pad voltage is varied.

12. The method of claim 11 wherein said first output drive circuit is active when said pad voltage is less than a first voltage.

13. The method of claim 12 wherein said first voltage is 0.8V.

14. The method of claim 11 wherein said second output drive circuit is active when the pad voltage is greater than a first voltage and less than a second voltage.

15. The method of claim 14 wherein said first voltage is 0.8V and said second voltage is 1.5V.

16. The method of claim 11 wherein said third output drive circuit is active when the pad voltage is greater than a second voltage.

17. The method of claim 16 wherein said second voltage is 1.5V.

18. The method of claim 11 wherein said first controlled output drive circuit provides a constant drive capability.

19. The method of claim 11 wherein said second controlled output drive circuit provides a linear drive capability.

20. The method of claim 11 wherein said third controlled output drive circuit provides a linear drive capability.

* * * * *